United States Patent
Ozawa (10) Patent No.: US 6,501,535 B1
(45) Date of Patent: Dec. 31, 2002

(54) EXPOSURE CONTROL METHOD AND APPARATUS

(75) Inventor: Ken Ozawa, Kawaguchi (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/478,337

(22) Filed: Jan. 6, 2000

Related U.S. Application Data (63) Continuation of application No. 08/863,688, filed on May 27, 1997, now abandoned.

(30) Foreign Application Priority Data

May 28, 1996 (JP) .............................................. 8-132988

(51) Int. Cl.$^7$ .......................... G03B 27/72; G03B 27/74
(52) U.S. Cl. .............................. 355/68; 355/53; 355/69
(58) Field of Search .............................. 355/53, 67, 68, 355/69, 70, 71; 356/394; 250/205; 372/30

(56) References Cited

U.S. PATENT DOCUMENTS

| | | | |
|---|---|---|---|
| 4,611,270 A | 9/1986 | Klauminzer et al. | |
| 4,970,546 A | 11/1990 | Suzuki et al. | |
| 5,097,291 A | 3/1992 | Suzuki | |
| 5,191,374 A | 3/1993 | Hazama et al. | |
| 5,473,412 A | 12/1995 | Ozawa | |
| 5,567,928 A | 10/1996 | Sano | |
| 5,627,627 A | 5/1997 | Suzuki | |
| 5,728,495 A | 3/1998 | Ozawa | |
| 5,861,944 A | * 1/1999 | Nishi | 355/68 |
| 5,965,308 A | 10/1999 | Ozawa | |
| 6,204,911 B1 | * 3/2001 | Kurosawa et al. | 355/53 |
| 6,268,906 B1 | * 7/2001 | Suzuki | 355/53 |

FOREIGN PATENT DOCUMENTS

| | | |
|---|---|---|
| JP | 6-260384 A | 9/1994 |
| JP | 8-274399 | 10/1996 |

OTHER PUBLICATIONS

"Exposure Dose Control Techniques for Excimer Laser Lithography" by David H. Tracy and Fred Y Wu, 1988, published in Proceedings of the SPIE, vol. 922, Optical/Laser Microlithography, pp. 437–443.*

* cited by examiner

*Primary Examiner*—Alan A. Mathews
(74) *Attorney, Agent, or Firm*—Nixon & Vanderhye P.C.

(57) ABSTRACT

In an exposure control method and apparatus, pulsed illumination light from an excimer laser light source is reduced by an energy rough modulator before illuminating a reticle. The reticle and a wafer are moved or scanned relative to a projection optical system to sequentially transfer a pattern image of the reticle to individual shot areas on a wafer. An integrator sensor indirectly monitors the amount of exposure on the wafer, and an energy monitor monitors the energy of pulsed illumination light inside the excimer laser light source. Based on the result of measurement by the integrator sensor and the correlation between the result of measurement by the integrator sensor and the result of measurement by the energy monitor, the emission power of the excimer laser light source is finely modulated at a high speed without employing an energy fine modulator that finely modulates the transmittance by a mechanical drive and without causing an energy loss along the optical path of illumination light.

44 Claims, 7 Drawing Sheets

EXPOSURE CONTROL METHOD AND APPARATUS

This is a continuation of application Ser. No. 08/863,688, filed May 27, 1997, now abandoned, the entire content of which is hereby incorporated by reference in this application.

BACKGROUND OF THE INVENTION

The present invention relates to a method and apparatus for controlling the amount of exposure of a photosensitive substrate in an exposure apparatus used in a lithography process for producing, for example, semiconductor devices, liquid crystal display devices, image pickup devices (such as charge coupled devices), or thin-film magnetic heads. The invention is suitable for use in full wafer exposure apparatus and, more particularly, for use in exposure control in a scanning projection exposure apparatus of, for example, a scan-and-step type.

The production of semiconductor devices and the like conventionally employs a projection exposure apparatus to project and transfer the pattern of a reticle onto each shot area on a wafer (or a glass plate) coated with a photoresist. As a basic function, the projection exposure apparatus controls the total amount of exposure (total exposure energy) of each point in each shot area on a wafer within an appropriate amount range.

For the exposure control of conventional full wafer projection exposure apparatus, such as steppers, cut-off control is normally performed whether the exposure light source employed is a continuous light source such as an extra-high pressure mercury lamp, or a pulsed laser light source such as an excimer laser light source. In the cut-off control, a portion of the light for exposure of a wafer coated with a photosensitive material is branched and directed to an integrator sensor formed of a photoelectric detector, whereby the amount of exposure of the wafer is indirectly detected. The light emission is continued until the total of exposure amounts detected by the integrator sensor exceeds a predetermined level (critical level) corresponding to a total amount of exposure (hereinafter, referred to as "set amount of exposure") that is required for the photosensitive material used (in the case of continuous light, a shutter is closed when the critical level is exceeded).

In the case of exposure using a pulsed laser light source as an exposure light source, a desired precision reproducibility in exposure control can be achieved by using at least a certain number of laser light pulses for exposure (hereinafter, the "certain number" will be referred to as "minimum exposure pulse number") because energy varies from one laser light pulse to another. In the case of a highly sensitive resist for which the set amount of exposure is small, the exposure to at least the minimum exposure pulse number of laser light pulses may become impossible if laser light from the pulsed laser source is directly used for exposure. Therefore, if the set amount of exposure is small, the pulsed laser light must be reduced in intensity by, for example, a light reducing device disposed in the optical path, so that at least the minimum exposure pulse number of laser light pulses can be employed for exposure.

To enable transfer of a pattern of an increased area to a wafer with a high precision without imposing severe requirements on the projection optical system, a step-and-scan projection exposure apparatus has recently been developed that synchronously scans or moves a reticle and a wafer relative to the projection optical system while projecting the images of portions of the pattern of the reticle onto the wafer using the projection optical system, so as to sequentially transfer portions of the pattern of the reticle onto individual shot areas on the wafer by exposure. In such a scanning exposure type apparatus, exposure control regarding a point on a wafer is impossible, and the aforementioned cut-off control cannot be applied. Therefore, for exposure control in scanning exposure type exposure apparatus, the conventional art normally employs a method (open exposure control method) that controls the amount of exposure simply by totalling the light quantity of each illumination pulse, or a method (every pulse exposure amount control method) that controls the energy of every illumination light pulse by measuring the total amount of exposure of an area on a wafer in real time, the area included in a slit-like illumination field (exposed area) extending in the scanning direction, and calculating a target energy value of the next illumination light pulse based on the total amount of exposure.

The former control method requires fine adjustment of pulse energy to satisfy the following equation (1) wherein the number of exposure pulses is an integer in order to achieve a desired linearity in the exposure control:

$$\text{(set amount of exposure)} = \text{(number of pulses)} \times \text{(average energy per pulse)} \quad (1)$$

In equation (1), the average energy per pulse is a value measured by an integrator sensor immediately before exposure. The latter control method requires fine adjustment of the pulse energy at every emission of a pulse.

A conventional pulsed laser light source used in connection with either of the control methods contains an energy monitor formed by a photoelectric detector, and performs feedback control of the laser electric power source so that the detection result by the energy monitor conforms to an output energy value (central energy value) provided by an external device in order to constantly output light pulses of the same amount of energy. More specifically, the central energy value inputted to the pulsed laser light source is fixed, and the fine modulation of energy of a light pulse is performed using an energy fine modulator.

Figure 8A:
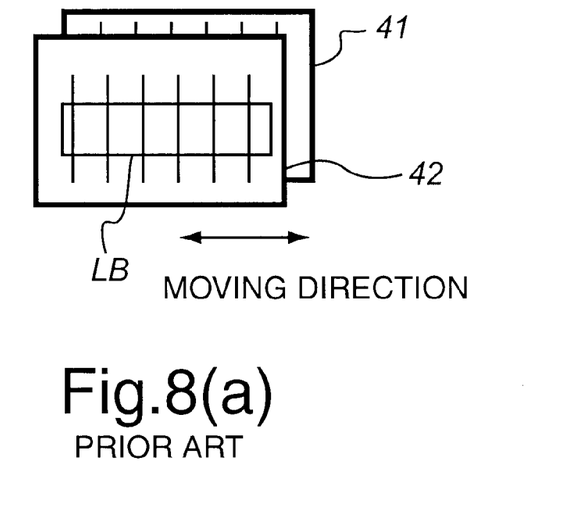
FIGS. 8(a) and 8(b) illustrate the constructions of conventional energy fine modulators.
Figure 8B:
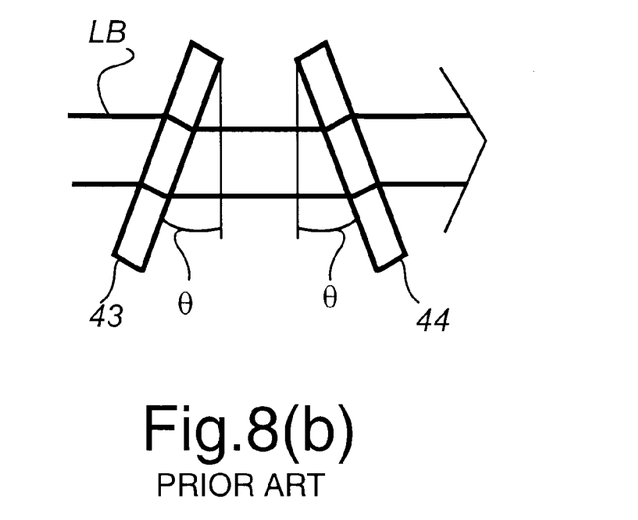

FIG. 8(a) illustrates a conventional energy fine modulator of a double grating type. In this fine modulator, a stationary grating 41 having light transmitting portions and blocking portions formed at a predetermined pitch and another grating 42 movable in the direction of the grating pitch are arranged one over the other in the optical path of a laser beam LB emitted in a pulsed manner. By shifting the positions of the gratings 41, 42 relative to each other, the laser beam transmittance can be finely modulated. FIG. 8(b) illustrates another conventional energy fine modulator in which two glass plates 43, 44 each coated with anti-reflection coating on both sides are arranged in the optical path of a laser beam LB, with the glass plates symmetrically inclined at a variable inclination angle θ. Exploiting a property of the glass plates 43, 44 that the transmittance varies depending on the incident angle of the laser beam LB, the fine modulator finely adjusts the overall laser beam transmittance by controlling the inclination angle θ.

The conventional energy fine modulators as shown in FIGS. 8(a) and 8(b), however, have drawbacks in that since a mechanical drive is employed for the adjustment of transmittance, high-speed adjustment of transmittance is difficult. Moreover, since neither of the fine modulators is able to achieve a maximum transmittance of 100%, an energy loss results even in an initial maximum transmittance state, thus adversely affecting device efficiency in utilizing the pulsed light.

The double grating type energy fine modulator as shown in FIG. 8(a) has another drawback in that even though the fine modulator is disposed at the light source-side of a fly eye lens provided as an optical integrator, the overlapping effect of the fly eye lens becomes small if the aperture of the illumination diaphragm is small, so that the grating pattern slightly remains as an illumination non-uniformity in an image. A small aperture of the illumination diaphragm means that a so-called a value, that is, a coherence factor, is small.

SUMMARY OF THE INVENTION

Accordingly, it is an object of the present invention to provide an exposure control method capable of finely modulating the energy of illumination light and therefore the amount of exposure of a photosensitive substrate at a high speed without inserting a mechanically-driven energy fine modulator for finely modulating the transmittance (light reduction rate) in the optical path of illumination light, and without causing an energy loss along the optical path of illumination light.

It is another object of the present invention to provide an exposure control apparatus capable of employing the exposure control method of the invention.

According to an aspect of the present invention, there is provided an exposure control method for controlling an amount of exposure of a photosensitive substrate to illumination light in an exposure apparatus that illuminates a mask having a pattern with illumination light emitted from an exposure light source and thereby exposes a photosensitive substrate to the illumination light through the mask to transfer the pattern of the mask to the substrate. In the method, the emitting power of the exposure light source is finely modulated within a predetermined range to control the amount of exposure of the photosensitive substrate. By directly controlling the emitting power of the exposure light source, the method of the invention finely modulates the energy of illumination light without employing mechanical drive and without causing an energy loss along the optical path of the illumination light.

If a pulsed laser light source, such as an excimer laser light source, is used as the exposure light source, the range of energy fine modulation required in order to obtain an integer number of exposure light pulses for each point on the photosensitive substrate is at most plus or minus several percent. Therefore, if an excimer laser light source is used, it becomes possible to make the central energy (emission power) of each pulse from the light source variable within the range required for an integer number of exposure light pulses.

It is preferred that the illuminance of the illumination light in each shot area on the photosensitive substrate be monitored during sequential exposures of a plurality of shot areas, and that the emission power of the exposure light source be finely modulated in accordance with a monitoring deviation result from a target value for exposure of the next shot area on the photosensitive substrate. Thereby, the emission power setting of the exposure light source can be updated, for example, during a shift from one shot area to another.

According to another aspect of the present invention, there is provided an exposure control method for controlling an exposure amount of a photosensitive substrate to illumination light in an exposure apparatus that illuminates a mask having a pattern with illumination light emitted from an exposure light source and thereby exposes a photosensitive substrate to the illumination light through the mask to transfer the pattern of the mask to the substrate. The method includes determining a table of correlation between an illuminance of the illumination light occurring inside or immediately out of the exposure light source and an illuminance of the illumination light occurring on the photosensitive substrate, and controlling the amount of exposure of the photosensitive substrate to the illumination light on the basis of the table of correlation.

According to this method, the illuminance of the illumination light at the exposure light source is detected by, for example, an energy monitor disposed in the exposure light source, and the illuminance of the illumination light on the photosensitive substrate is detected by, for example, an energy monitor of the exposure apparatus. The table of correlation between the outputs from the two energy monitors is determined and stored as a control table. The amount of exposure of the photosensitive substrate is controlled by, for example, fine modulation of the exposure light source emission power. This fine modulation is based on the output from the energy monitor of the exposure apparatus, not the output from the energy monitor of the exposure light source. More specifically, an output of the energy monitor in the exposure light source is determined from the output of the energy monitor of the exposure apparatus and the table of correlation, and the thus-determined output of the energy monitor in the exposure light source is used as a reference for finely modulating the emission power of the exposure light source. Thereby, the exposure control linearity (that is, linearly between target amount of exposure and actual amount of exposure) can be obtained on the basis of the output of the energy monitor of the exposure apparatus.

It is preferred to determine the table of correlation when dummy light emission from the exposure light source is performed without exposing the photosensitive substrate.

It is also preferred to update the table of correlation if a change is expected in the correlation between the illuminance of the illumination light occurring inside or immediately out of the exposure light source and the illuminance of the illumination light occurring on the photosensitive substrate.

Since the correlation between the outputs of the two energy monitors is expected to fluctuate over time, an exposure apparatus-side energy monitor-based exposure control linearity that is stable for a long time can be achieved by sampling data for preparation of a correlation table to update the correlation table if there is a likelihood that the deviation from the correlation will exceed a predetermined amount, i.e., a likelihood that the error of the correlation table will exceed an allowable amount.

In addition, if the exposure light source is a pulsed laser light source, there exists a requirement for a desired exposure reproducibility (reproducibility of the amount of exposure for each area on the photosensitive substrate in the case of scanning exposure), i.e., a minimum number of pulses required (minimum exposure pulse number $N_{min}$). To meet this requirement, the light intensity is reduced by, for example, an energy rough modulator disposed in the optical path, depending on the relationship between the set amount of exposure and the energy per pulse, so that the exposure will be completed by using at least $N_{min}$ number of exposure pulses. The range of pulse energy incident on the energy monitor in the exposure light source is narrow, whereas the range of pulse energy incident on the exposure apparatus-side energy monitor is wide. The difference therebetween is, for example, at least 100 fold if an excimer laser light source is employed. Since the correlation between the two energy monitors changes depending on the transmittance in the energy rough modulator, it is preferred to sample data for a correlation table, as well as for an energy determination, prior to exposure while the energy rough modulator is in operation, and to prepare a correlation table based on the sampled data for updating the correlation table. By performing this process, the exposure control linearity based on the exposure apparatus-side energy monitor can be achieved for any set amount of exposure.

If the exposure light source is a pulsed emission type light source in either of the two exposure control methods, it is preferred that the exposure light source pre-emit a number of pulses necessary for stabilization of the emission power of the exposure light source when the light source emission power setting is changed. In a scanning type exposure apparatus, pre-emission (dummy emission) of light may be performed while the illumination field aperture is closed, for example, during the period of acceleration of a stage system, i.e., the preparation time for the scanning exposure operation, or the stabilizing time.

According to still another aspect of the present invention, there is provided an exposure control apparatus for controlling an amount of exposure of a photosensitive substrate to illumination light in an exposure apparatus that illuminates a mask having a pattern with illumination light emitted from an exposure light source and thereby exposes a photosensitive substrate to the illumination light through the mask to transfer the pattern of the mask to the substrate. The apparatus includes a light source modulation unit that finely modulates an emission power of the exposure light source within a predetermined range, a first energy monitor for detecting an illuminance of the illumination light occurring inside or immediately out of the exposure light source, a second energy monitor for detecting an illuminance of the illumination light on the photosensitive substrate, and a controller for controlling the light source modulation unit on the basis of the detection results of the first and second energy monitors. This exposure control apparatus is able to employ either of the exposure control methods.

BRIEF DESCRIPTION OF TIME DRAWINGS

These and other aspects and advantages of the present invention will be described in detail with reference to the accompanying drawings, in which.

DETAILED DESCRIPTION OF PREFERRED EMBODIMENTS

A preferred embodiment of the present invention will be described in detail hereinafter with reference to the accompanying drawings. In the preferred embodiment, the apparatus and method of the invention are employed for exposure control in a step-and-scan projection exposure apparatus that uses an excimer laser light source as a pulsed laser light source for exposure.

Figure 1:
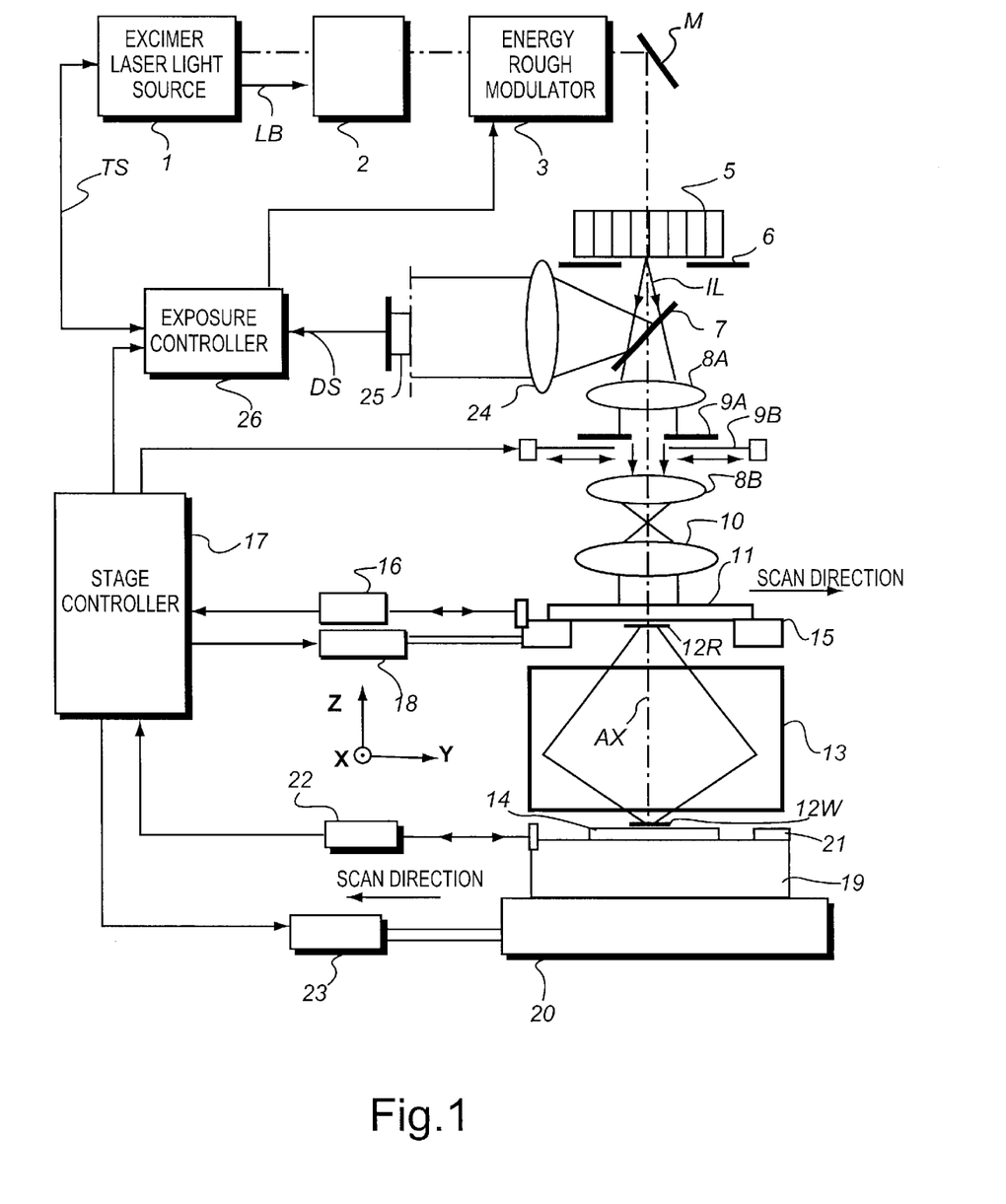
FIG. 1 schematically illustrates the construction of a step-and-scan projection exposure apparatus used according to the present invention.

Referring to FIG. 1, which illustrates a projection exposure apparatus according to the present invention, a laser beam LB emitted from an excimer laser light source 1 in a pulsed manner is subjected to the cross section shaping of the beam by a beam shaping optical system 2 constituted by a cylindrical lens, a beam expander or the like, so that the laser beam LB will be efficiently directed to a fly eye lens 5 disposed downstream. The excimer laser light source 1 according to the invention is, for example, a KrF excimer laser light source (oscillation wavelength: 248 nm), or an ArF excimer laser light source (oscillation wavelength: 193 nm). Other types of pulsed light sources for exposure may also be used such as, for example, a high-frequency wave generating device such as a YAG laser, a metal vapor laser, or the like.

The laser beam LB from the beam shaping optical system 2 goes into an energy rough modulator 3, which has a plurality of ND filters of different transmittances (=1-light reduction rate) that are arranged on a rotatable revolver. By rotating the revolver, the transmittance for the incoming laser beam LB can be changed from 100% to a plurality of levels. The revolver may be combined with a similar revolver to form a two-stage arrangement, so that combinations of the two sets of ND filters provide finer adjustment of transmittance.

The laser beam LB from the energy rough modulator 3 goes into the fly eye lens 5 via a mirror M for bending the optical path. The fly eye lens 5 has many secondary light sources for illuminating a downstream-disposed reticle 11 with a uniform illuminance distribution. Disposed adjacent the outgoing surface of the fly eye lens 5 is an illumination-system aperture diaphragm (so-called a diaphragm) 6. The laser beam emitted from a secondary light source provided in the aperture diaphragm 6 (hereinafter, referred to as "pulsed illumination light IL") strikes a beam splitter 7 having a low reflectance and a high transmittance. The pulsed illumination light IL transmitted through the beam splitter 7, that is, light for exposure, goes through a first relay lens 8A and passes through a generally rectangular aperture of a stationary illumination field diaphragm (fixed reticle blind) 9A. The stationary illumination field diaphragm 9A is disposed in the vicinity of a conjugate surface with respect to the pattern surface of a reticle. Disposed in the vicinity of the stationary illumination field diaphragm 9A is a movable illumination field diaphragm 9B whose aperture is variable in width and position in the scanning direction. The illumination field is further limited by using the movable illumination field diaphragm 9B at the start and end of scanning exposure in order to prevent exposure of undesired portions of the wafer.

The pulsed illumination light IL passing through the stationary illumination field diaphragm 9A and the movable illumination field diaphragm 9B goes through a second relay lens 8B and a condenser lens 10 to illuminate a generally rectangular illumination area 12R on a reticle 11 held on a reticle stage with a uniform illuminance distribution. Thereby, an image reduced in size at a projection ratio α (α being, for example, 1/4, 1/5) from a pattern within the illumination area 12R on the reticle 11 through a projection optical system 13 is projected on an illumination field 12W on a wafer 14 coated with a photoresist, thus performing exposure. The below description will be made with the Z-axis set parallel with the optical axis AX of the projection optical system 13, the Y direction being the scanning direction of the reticle 11 relative to the illumination area 12R in a plane perpendicular to the optical axis AX (that is, the Y direction being parallel to a horizontal line in the plane of the sheet of FIG. 1), and the X direction being a non-scanning direction perpendicular to the scanning direction.

The reticle stage 15 is driven in the Y direction by a reticle stage drive 18. The Y-coordinate of the reticle stage 15 measured by a shift mirror fixed to the reticle stage 15 and an external laser interferometer 16 is supplied to a stage controller 17. Based on the coordinate thus supplied, the stage controller 17 controls the position and speed of the reticle stage 15 through the reticle stage drive 18.

A wafer 14 is placed on a Z-tilt stage 19 using a wafer holder (not shown). The Z-tilt stage 19 is mounted on an X-Y stage 20, which defines the position of the wafer 14 in the X direction and the Y direction and scans the wafer 14 in the Y direction. The Z-tilt stage 19 functions to adjust the position of the wafer 14 in the Z direction (focus position) and also to adjust the tilt angle of the wafer 14 to the X-Y plane. The X-coordinate and Y-coordinate of the X-Y stage 20 measured by a shift mirror fixed to the Z-tilt stage 19 and an external laser interferometer 22 are supplied to the stage controller 17. Based on the coordinates thus supplied, the stage controller 17 controls the position and speed of the X-Y stage 20 using a wafer stage drive 23.

The operation of the stage controller 17 is controlled by a main control system (not shown) that centrally controls the entire apparatus. During scanning exposure, the reticle 11 is scanned at a speed $V_R$ in the +Y direction (−Y direction) by using the reticle stage 15 and, synchronously with the scan of the reticle stage 15, the wafer 14 is scanned at a speed $\alpha \cdot V_R$ (α being a ratio of projection from the reticle 11 to the wafer 14) in the −Y direction (or +Y direction) relative to an illumination field 12W by using the X-Y stage 20.

An illumination non-uniformity sensor 21 constituted by a photoelectric conversion device is disposed in the vicinity of the wafer 14 on the Z-tilt stage 19. A light-receiving surface of the illumination non-uniformity sensor 21 is set to the same height as that of the surface of the wafer 14. The illumination non-uniformity sensor 21 may be a PIN type photodiode or the like that has a sensitivity in a far ultraviolet radiation range and a high response frequency to detect illumination light pulses. The detection signal from the illumination non-uniformity sensor 21 is supplied to an exposure controller 26 through a peak hold circuit and an analog-digital (A-D) converter (not shown).

The pulsed illumination light IL reflected from the beam splitter 7 is received by an integrator sensor 25 constituted by a photoelectric conversion device, through a condenser lens 24, as indicated in FIG. 1. The photoelectric conversion signal from the integrator sensor 25 is sent through a peak hold circuit and an A-D converter (not shown) and supplied as an output DS (digit/pulse) to the exposure controller 26. The coefficient of correlation between the output DS from the integrator sensor 25 and the illuminance of the pulsed illumination light IL (amount of exposure) is determined and stored in the exposure controller 26 beforehand. The exposure controller 26 controls the energy rough modulator 3. The stage controller 17 controls the opening and closing operation of the movable illumination field diaphragm 9B synchronously with the operation information about the stage system.

The construction of an exposure control system according to the invention will be described with reference to FIG. 2.

Figure 2:
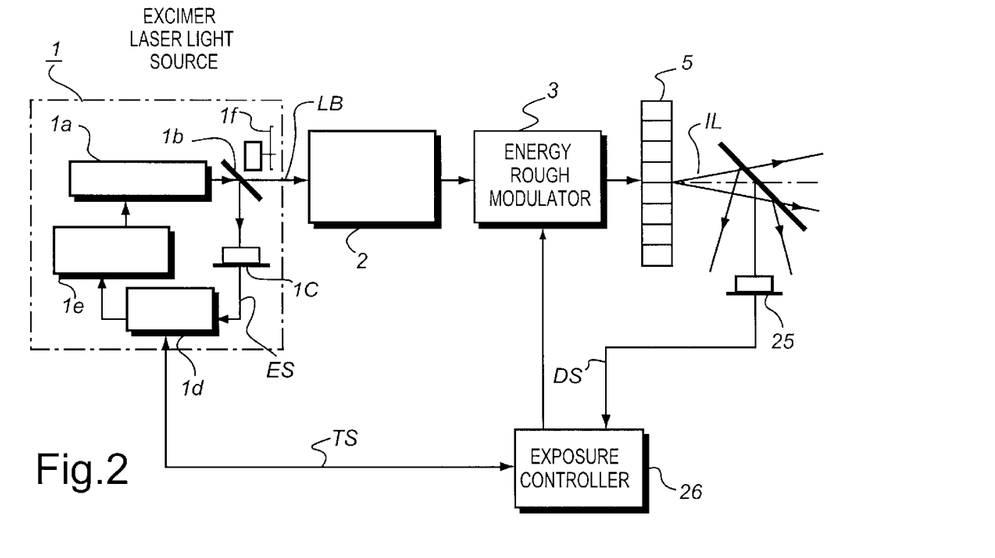
FIG. 2 is a block diagram of an exposure control system of the projection exposure apparatus shown in FIG. 1.

FIG. 2 illustrates the exposure control system of the projection exposure apparatus shown in FIG. 1. Inside the excimer laser light source 1, a laser beam emitted in a pulsed manner from a laser resonator 1a strikes a beam splitter 1b having a high transmittance and a very low reflectance. The laser beam LB transmitted through the beam splitter 1b is emitted to the outside. The laser beam reflected from the beam splitter 1b strikes an energy monitor 1c constituted by a photoelectric conversion device. The photoelectric conversion signal from the energy monitor 1c is sent through a peak hold circuit (not shown) and supplied as an output ES to an energy controller 1d. The unit of the control amount of energy corresponding to the output ES from the energy monitor 1c is mJ/pulse. During normal emission, the energy controller 1d controls the source voltage of a high voltage power source 1e so that the output ES from the energy monitor 1c becomes a value corresponding to a target value of the energy per pulse included in the control information TS supplied from the exposure controller 26. In accordance with the source voltage, the energy per pulse in the laser resonator 1a is determined. Thereby, the energy per pulse in the excimer laser light source 1 becomes a value instructed by the exposure controller 26.

Although the energy per pulse in the excimer laser light source 1 is normally stabilized at a predetermined central energy value $E_0$, it is designed such that the energy per pulse can be varied above or below the central energy value $E_0$ within a predetermined range. The excimer laser light source 1 also has a shutter If that is disposed outwardly of the beam splitter 1b for blocking the laser beam LB in accordance with the control information from the exposure controller 26.

For preparation or update of a control table described below, the output ES from the energy monitor 1c is supplied through the energy controller 1d to the exposure controller 26 as indicated in FIG. 2. The exposure controller 26 then determines a correlation between the output ES from the energy controller 1d and the output DS from the integrator sensor 25. For scanning exposure, the exposure controller 26 sends predetermined control information TS to the energy controller 1d to cause the excimer laser light source 1 to emit pulsed light, and adds up the output DS from the integrator sensor 25 of every illumination light pulse to sequentially determine a total amount of exposure at each point on the wafer 14. The exposure controller 26 then adjusts the energy rough modulator 3 transmittance and finely adjusts the energy per pulse in the excimer laser light source 1 so that the total amount of exposure becomes a set amount of exposure of the photoresist on the wafer 14.

An example operation of the exposure control by the projection exposure apparatus as shown in FIGS. 1 and 2 will be described in detail.

(A) Preparation of Control Table

The procedure of preparing a control table to be used as a basis for controlling the amount of exposure will first be described. Since a control table is prepared by mainly using the integrator sensor 25 disposed in the main body of the projection exposure apparatus according to the invention, the unit of the output ES from the energy monitor 1c in the excimer laser light source 1 (the unit of energy control amount) is assumed to be mJ/pulse. The unit of the output DS from the integrator sensor 25 (the unit of energy control amount) is digit/pulse as mentioned above.

According to the invention, it is assumed that the output DS from the integrator sensor 25 is calibrated, beforehand, with respect to the output from a reference illuminometer (not shown) disposed at the same height as the image surface (that is, the surface of the wafer) on the Z-tilt stage 19 shown in FIG. 1. The unit of data processing of a reference illuminometer is mJ/(cm²·pulse), which is a physical quantity. The calibration of the integrator sensor 25 obtains a conversion coefficient or a conversion function for conversion of the output DS (digit/pulse) of the integrator sensor 25 into amount of exposure (mj/(cm²·pulse)) on an image surface. Using such a conversion coefficient or a conversion function, it becomes possible to indirectly measure the amount of exposure on an image surface based on the output DS from the integrator 25. Therefore, in the below description, the amount of exposure on an image surface indirectly determined from the output DS of the integrator sensor 25 is regarded as a processing amount (mJ/(cm²·pulse)) by the integrator sensor 25.

What is to be determined herein is the amount of exposure on the image surface, which can be determined on the basis of a correlation between the processing amount (mJ/(cm²·pulse)) of the integrator sensor 25 and the output ES (mJ/pulse) of the energy monitor 1c in the excimer laser light source 1. As a prerequisite for the determination of such correlation, it is assumed that the energy E per pulse of the laser beam LB (indicated in FIG. 1) from the excimer laser light source 1 is stabilized at a predetermined central energy value $E_0$. It is also assumed that the transmittance of the energy rough modulator 3 is set to 100% (fully open).

According to the invention, the energy E of the laser beam LB is varied above and below the central energy value $E_0$, as in equation (2).

$$E = E_0 \{1 \pm (i/N_{DATA}) \times E_R/E_0\} \qquad (2)$$

where $N_{DATA}$ is the number of data used for the sampling of correlation data, $E_R$ is a necessary energy modulation range (typically, $E_R/E_0 = 0.02$ to $0.03$), and i is an integer. The integer i is varied in the range of, for example, 0 to $N_{DATA}$.

While the excimer laser light source 1 is actually performing pulsed light emission with the value i being varied, values $P_i$ of the processing amount of the integrator sensor 25 and values $E_i$ of the output ES of the energy monitor 1c are recorded as correlation data ($P_i$, $E_i$). A piece of correlation data may be obtained from a single pulse, or as average values over a plurality of pulses, or the like, as long as the values $P_i$, $E_i$ are synchronously measured.

Figure 3:
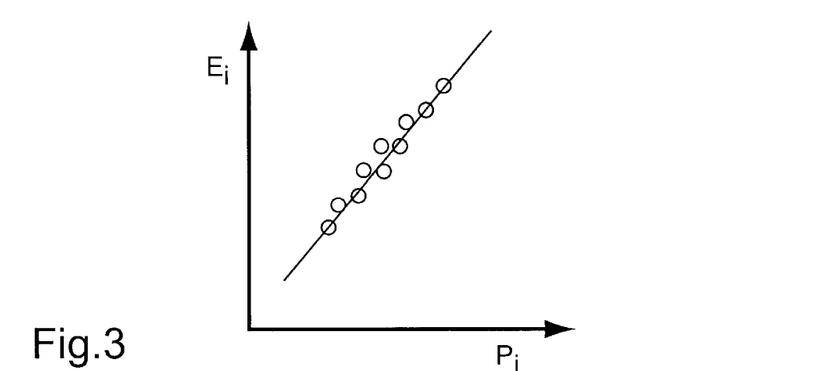
FIG. 3 is a graph indicating example correlation data between the processing amount of an integrator sensor and the output from an energy monitor.

FIG. 3 indicates the correlation data ($P_i$, $E_i$) thus obtained, where the abscissa axis indicates the value $P_i$ of the processing amount of the integrator sensor 25 and the ordinate axis indicates the value $E_i$ of the output of the energy monitor 1c. After an appropriate processing, for example, interpolation of the correlation data as indicated in FIG. 3, either a conversion function f(P) for calculating an output ES (mJ/pulse) of the energy monitor 1c from a processing amount P (mJ/(cm²·pulse)) of the integrator sensor 25 or a conversion coefficient for determining an output ES from a processing amount P is determined. The conversion function f(P) or the conversion coefficient is stored as a control table in the exposure controller 26. Thereby, the exposure controller 26 becomes able to precisely calculate an output ES of the energy monitor 1c based on the control table and a processing amount P of the integrator sensor 25.

To make the below description easier to understand, it is assumed that the correlation between the integrator sensor 25 and the energy monitor 1c is substantially linear so that the correlation data (Pi, Ei) can be expressed by a linear function as indicated by a solid straight line in FIG. 3, and that the offset can be regarded as zero so that the gradient of the line can be used as a conversion coefficient β. Therefore, it is assumed that an output ES (mJ/pulse) can be calculated based on the conversion coefficient β and a processing amount P (mJ/(cm²·pulse)), in accordance with the following equation:

$$ES = \beta \cdot P \qquad (3)$$

According to the invention, the conversion coefficient β is determined from the correlation data as shown in FIG. 3 through, for example, least square approximation, and then stored as a control table in the exposure controller 26. The preparation of the control table is thus completed.

(B) Basic Sequence of Exposure Control

A basic sequence of the exposure control by the projection exposure apparatus as shown in FIGS. 1 and 2 will be described with reference to the flowchart of FIG. 6. Since the transmittance of the energy rough modulator 3 for the laser beam LB from the excimer laser light source 1 only needs to be set such that the number of exposure pulses becomes at least a necessary number of exposure pulses, the below description will be made mainly in conjunction with the operation of finely modulating the energy of the laser beam LB.

The quantities used in the below description are defined as follows:

$S_0$ is the of exposure on the photoresist on a wafer to be achieved, which is set by an operator (set amount of exposure); N is the number of pulses of pulsed illumination light IL provided per point on a wafer (exposure pulse number); p is the average pulse energy density on an image surface indirectly measured through the integrator sensor 25 prior to exposure (mJ/(cm²·pulse)); $A_{rep}$ is the reproducibility of exposure amount per point on a wafer; $A_t$ is the target error of average exposure amount error with respect to a set exposure amount within each shot area on a wafer (exposure amount target value precision); $A_E$ is the total exposure amount precision with respect to a desired set amount of exposure per point on a wafer in accordance with the following equation:

$$A_E = A_{rep} + A_t \qquad (4);$$

$P_t$ is the set pulse energy based on the integrator sensor 25 (mJ/(cm²·pulse)); and $E_t$ is the set value of energy of the laser beam LB that the excimer laser light source 1 receives from the exposure controller 26 (mJ/pulse) in accordance with the following equation corresponding to equation (3):

$$E_t = \beta \cdot P_t \qquad (5)$$

A normal exposure control sequence is as follows.

Figure 6:
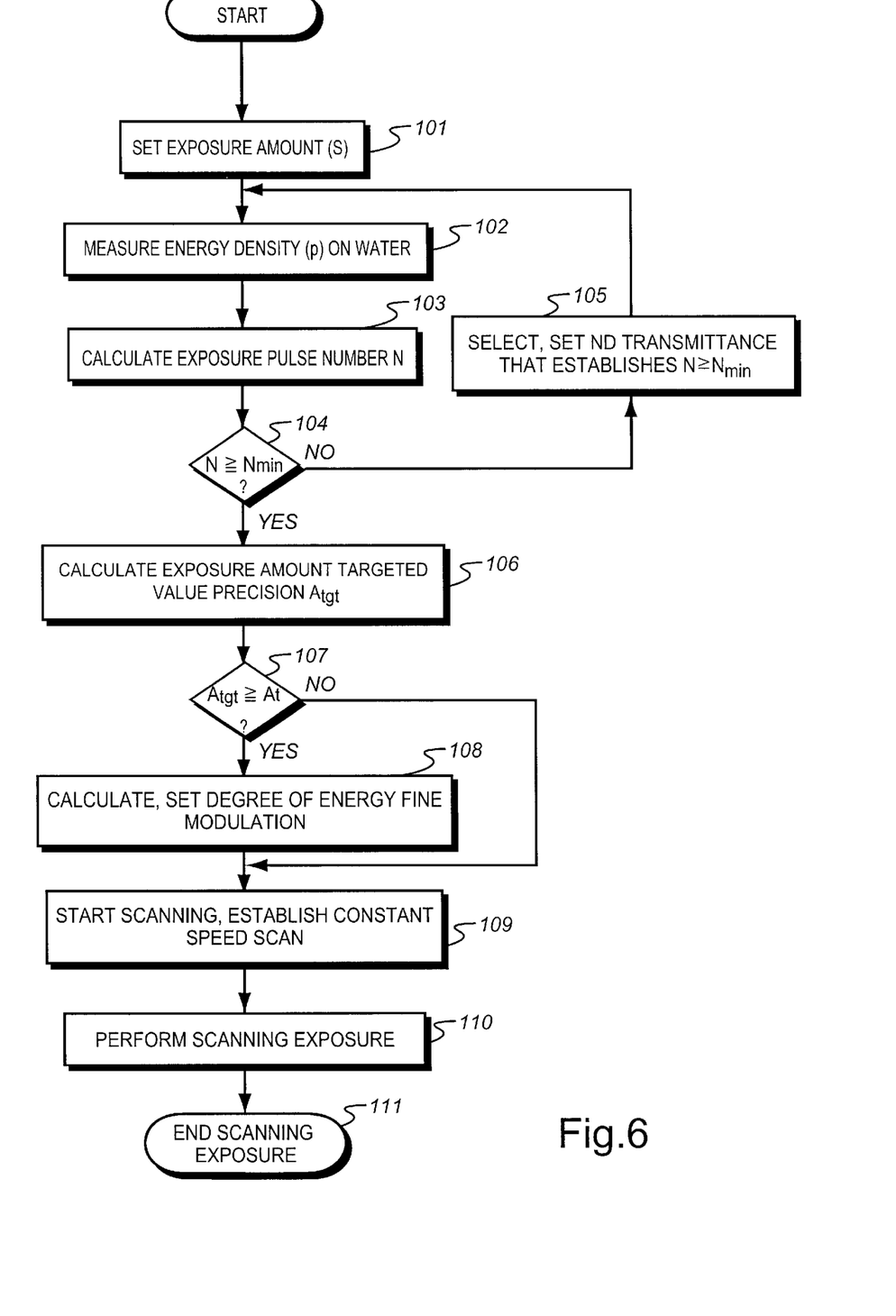
FIG. 6 is a flowchart illustrating an example of the normal exposure control operation for scanning exposure by the projection exposure apparatus shown in FIG. 1.

In step 101 of the flowchart of FIG. 6, an operator sets a set exposure amount $S_0$ for the photoresist on a wafer into the exposure controller 26. In response, the exposure controller 26 sets an energy value $E_t$ of energy of the laser beam LB per pulse to the central energy value $E_0$.

Subsequently in step 102, the exposure controller 26 causes the excimer laser light source 1 to perform pulsed light emission a plurality of times (for example, several hundred times) and totals the outputs from the integrator sensor 25, so as to indirectly measure an average pulse energy density p (mJ/(cm²·pulse)) on the wafer. The excimer laser light source 1 then calculates an exposure pulse number N using the following equation:

$$N = \text{cint}(S_0/p) \quad (6)$$

where the function cint rounds off the decimal fraction and more specifically increases the integer of $S_0/p$ by 1 if the digit in the first decimal place exceeds or equals 5 or otherwise, discards the decimal fraction. Subsequently, the exposure pulse number N thus determined is checked in step 104 to see whether it exceeds or equals the minimum exposure pulse number $N_{min}$ needed to obtain the necessary exposure amount control reproducing precision. If $N \geq N_{min}$, the operation proceeds to step 106, in which an actual value $A_{tgt}$ of the exposure amount target value precision is calculated in accordance with the following equation:

$$A_{tgt} = \text{ABS}(1 - pN/S_0) \quad (7)$$

where the function ABS is a function that provides an absolute value.

It is checked in step 107 whether fine modulation of the pulse energy in the excimer laser light source 1 is needed, i.e., whether the actual value $A_{tgt}$ of the exposure amount target value precision exceeds or equals the aforementioned exposure amount target value precision $A_t$. If the actual value $A_{tgt}$ is less than the aforementioned exposure amount target value precision $A_t$, the operation proceeds to step 109, and exposure is performed. Conversely, if $A_{tgt} \geq At$, which means that fine modulation of the pulse energy is needed, the operation proceeds to step 108. In step 108, a set pulse energy $P_t$ (mJ/(cm²·pulse)) based on the integrator sensor 25 is calculated in accordance with the following equation:

$$P_t = S_0/\text{cinct}(S_0/P) \quad (8)$$

A set energy value $E_t$ (mJ/pulse) of the laser beam LB in the excimer laser light source 1 is then calculated in step 108 in accordance with equation (5) using the conversion coefficient β stored as a control table in the exposure controller 26, and the set energy value $E_t$ is supplied to the energy controller 1d shown in FIG. 2. The reticle 11 and the wafer 14 is then accelerated in the projection exposure apparatus shown in FIG. 1 in step 109. If constant-speed synchronous scan is established, scanning exposure is performed in step 110, and exposure is ended for a shot area in step 111.

Since the pulse energy of the excimer laser light source 1 is finely modulated according to this invention, the invention is able to control the amount of exposure of the wafer to the laser beam LB with high speed and high precision, so that a desired total amount exposure of each point on a wafer can be achieved. The invention has another advantage in that the light quantity loss of the laser beam LB along the optical path is minimized, and therefore, the efficiency in utilizing the laser beam LB is increased.

If the exposure pulse number N is less than the minimum exposure pulse number $N_{min}$ in step 104 in FIG. 6, the operation proceeds to step 105, in which a transmittance that establishes $N \geq N_{min}$ is selected from the transmittances determined by the ND filters (or the combinations thereof) of the energy rough modulator 3, and the transmittance is set, and the process returns to step 102.

(C) Real Time (Every Shot) Update of Control Table

The basic exposure control sequence is effective only in the case where a prepared control table, that is, a conversion coefficient β, is stable and the excimer laser light source 1 operates in accordance with the instructions from the exposure controller 26. In actual operation of the exposure control system shown in FIG. 1, however, the fluctuation over time of the sensitivity of the integrator sensor 25 and the energy monitor 1c and the fluctuation over time of the transmittance and reflectance of the optical system disposed therebetween can become significant. Therefore, to achieve exposure control that is stable for a long time, it becomes necessary to update the correlation (conversion coefficient β) between the integrator sensor 25 and the energy monitor 1c by employing laser emission other than the emission for exposure, or using data of pulse energy obtained in real time during exposure. The basic concept is described below.

In the below description, N represents the exposure pulse number, and $P_i$ represents the processing amount P (mJ/(cm²·pulse)) by the integrator sensor 25 for the ith laser beam pulse. The total exposure amount $S_k$ at each point on a wafer is indirectly determined at every emission of a laser beam pulse by adding up the processing amounts $P_i$ of the integrator sensor 25 for N number of pulses that have occurred, as in equation (9):

$$S_k = P_k + P_{k-1} + \ldots + P_{k-N+2} + P_{k-N+1} \quad (9)$$

Figure 4:
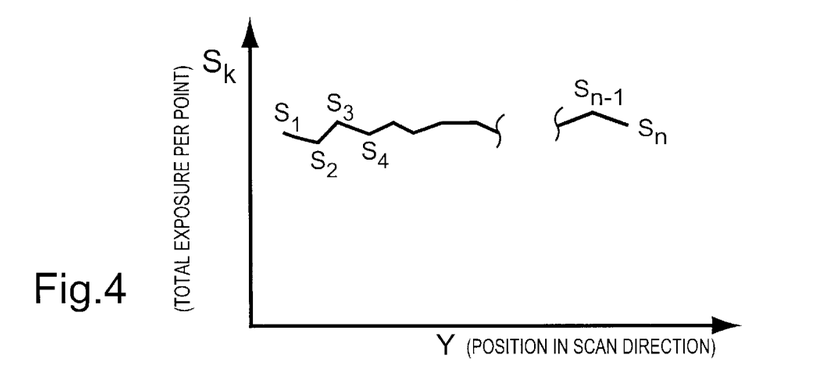
FIG. 4 exemplifies a total amount of exposure of a point on a wafer determined by totalling the processing amounts of the integrator sensor.

FIG. 4 is a graph in which total exposure amounts $S_k$ obtained for individual points in a shot area on a wafer sequentially every time a laser beam pulse is supplied are plotted in relation to the position Y of the points in the scanning direction. In this graph, the total exposure amount $S_k$ changes as indicated by the bent line. From the data of the total exposure amount $S_k$, the average total exposure amount $S_{ave}$, the maximum total exposure amount $S_{max}$ and the minimum total exposure amount $S_{min}$ within the shot area are determined. Based on these data, it is determined whether the result of the total exposure amounts in the shot area that has just been exposed is good. If it is not good, the content of the result is examined and fed back for the exposure of the next shot area. In this exposure control, the data measured by the energy monitor 1c and the data measured by the integrator sensor 25 are synchronously stored during exposure. After the exposure, the energy controller 1d transmits a target value of the data measured by the energy monitor 1, the actual measured data, the average value and the like to the exposure controller 26. Since the target value and actual values of data measured by the integrator sensor 25 are stored in the exposure controller 26, the exposure controller 26 performs the procedure as described below, to determine whether the performance of exposure control is good.

Figure 7A:
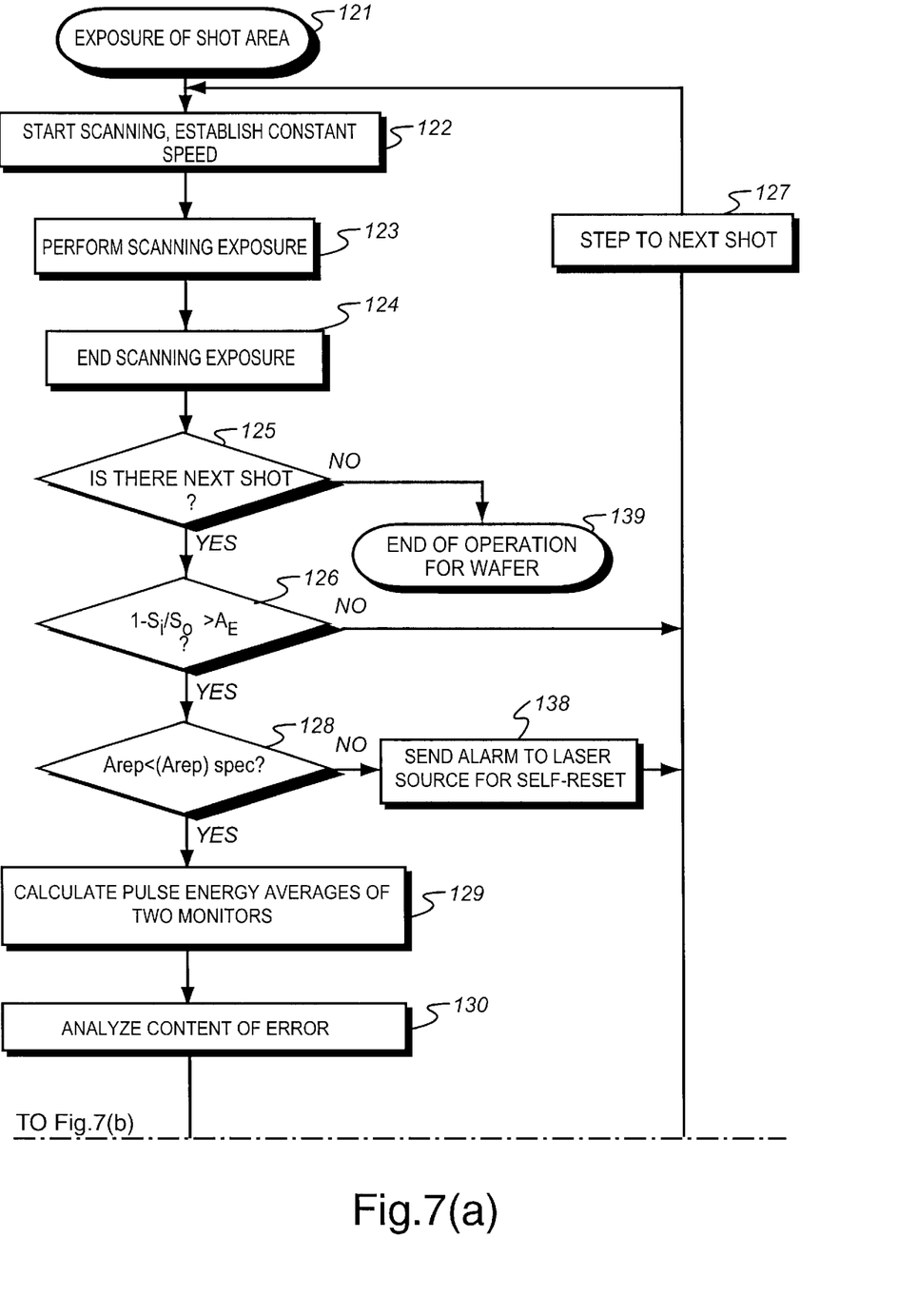
FIGS. 7(a) and (b) are a flowchart illustrating an example of the exposure control operation for updating a control table that is performed, if necessary, for every shot area by the projection exposure apparatus shown in FIG. 1.
Figure 7B:
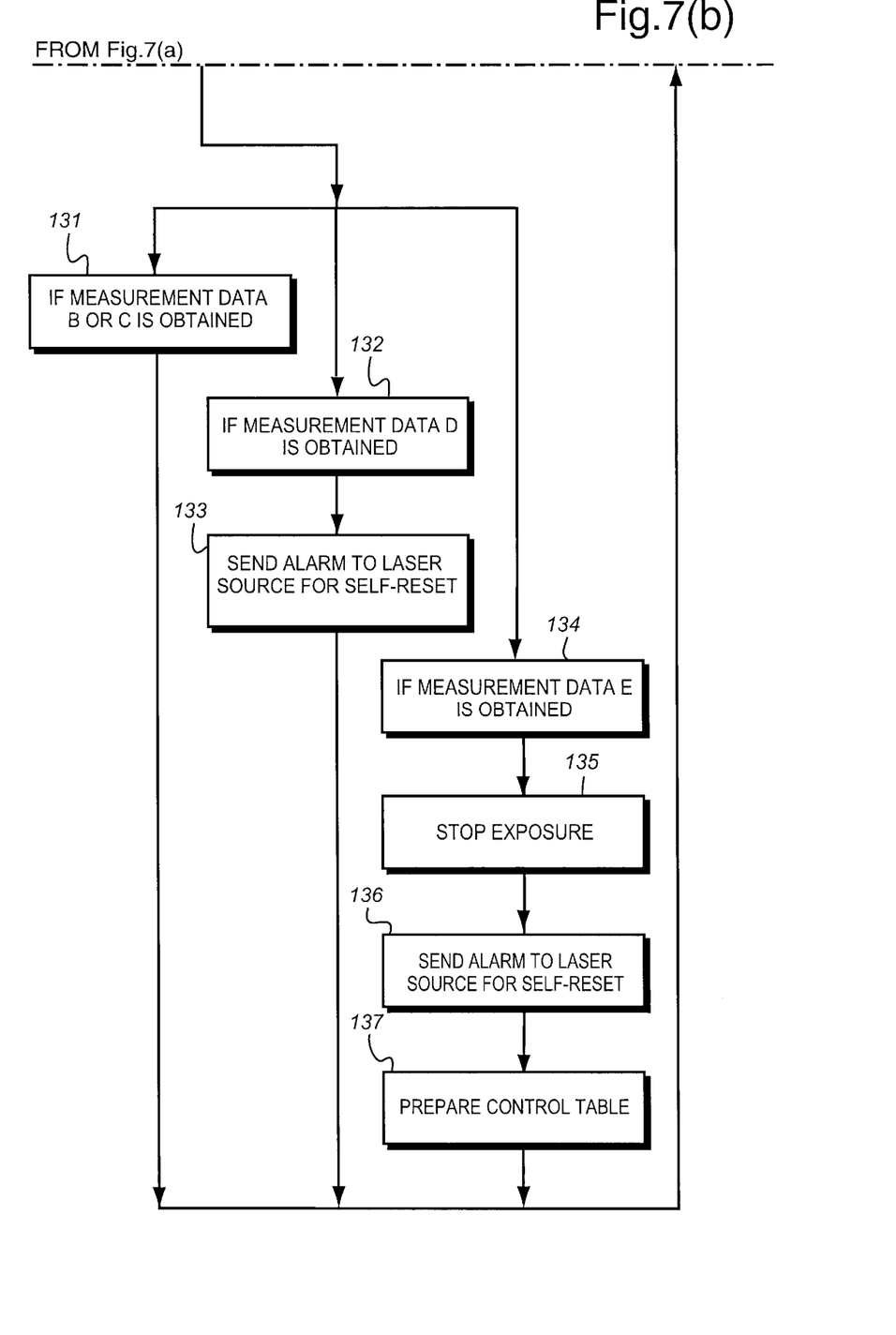

FIGS. 7(a) and (b) illustrate the sequence of the exposure control operation to be performed in the aforementioned case. In step 121, the exposure controller 26 starts the exposure operation for a shot area. In step 122, the reticle and the wafer are accelerated, and synchronization is established therebetween. Scanning exposure is then performed in step 123 and ended in step 124. If it is determined in step 125 that there is no shot area left unexposed, the exposure of the entire wafer is ended in step 139. Conversely, if it is determined in step 125 that there is an unexposed shot area, the operation proceeds to step 126, in which the control table is updated if necessary, as described below.

During the scanning exposure in step 123, every time an illumination light pulse is supplied, a total exposure amount $S_k$ is determined in accordance with equation (9), that is, by adding the processing amounts Pi of the integrator sensor 25 for N number of pulses that have occurred, and the determined amount $S_k$ is to stored. The total exposure amounts $S_k$ thus stored are regarded as the total exposure amounts $S_1$–$S_n$ in FIG. 4. What is important as a result of exposure is whether the total exposure amounts are within an allowable range around a set amount of exposure. Therefore, it is determined in step 126 whether the amount of exposure of the shot area that has just been exposed (in step 121) is acceptable. More specifically, it is determined whether the error of the ith (i=1 to n) total exposure amount $S_i$ from the set exposure amount $S_0$ is less than or equal to the total exposure amount precision $A_E$ as follows:

$$|1-S_i/S_0| \leq A_E \tag{10}$$

If inequality (10) holds, the total exposure amount at each point within the shot area is appropriate, and there is no need to correct the pulse energy for the exposure of the next shot area. That is, if the error of the total exposure amount of the shot area is within an allowable range, the operation proceeds to step 127, where stepping to the scanning start position for the next shot area is performed. Then, the exposure operation in steps 122–125 follows.

Conversely, if inequality (10) does not hold in step 126, the operation proceeds to step 128 in order to determine whether the cause for the inappropriate exposure is variation in the total exposure amount from one point to another or an offset-like factor related to a deviation of the average pulse energy in the shot area. In step 128, an exposure amount reproducibility $A_{rep}$ is calculated from the maximum total exposure amount $S_{max}$ and the minimum total exposure amount $S_{min}$ in the shot area, in accordance with the following equation:

$$A_{rep} = (S_{max} - S_{min})/(S_{max} + S_{min}) \tag{11}$$

The exposure amount reproducibility $A_{rep}$ thus determined is compared with the specified exposure amount reproducibility $(A_{rep})_{spec}$. If $A_{rep} \geq (A_{rep})_{spec}$, which means that the variation in the pulse energy in the excimer laser light source 1 is not acceptable, the operation proceeds to step 138. In step 138, the exposure controller 26 sends alarm information to the energy controller 1d of the excimer laser light source 1. In response to the alarm information, the energy controller 1d starts a self-reset operation. In an example of the self-reset operation, the energy controller 1d closes the shutter 1f and stops light emission and then performs checking of the density of the gas for laser emission and the like (self-check) so as to enable normal laser oscillation (self-lock). After the self-reset, the energy controller 1d informs the exposure controller 26 of the completion. In response, the exposure controller 26 performs stepping to the scanning start position for the next shot area in step 127 followed by the exposure of the shot area.

If it is determined in step 128 that the exposure amount reproducibility $A_{rep}$ is less than the specified value $(A_{rep})_{spec}$, which means that the cause for the exposure control error is a deviation of the average pulse energy in the shot area, the operation proceeds to step 129. In step 129, the exposure controller 26 calculates an average total exposure amount $S_{ave}$ of the total exposure amounts $S_k$ as shown in FIG. 4, and determines from the calculated value an average value $P_r$ of the pulse energy based on the integrator sensor 25, in accordance with the following equation:

$$P_r = S_{ave}/N \tag{12}$$

On the side of the excimer laser light source 1, the energy controller 1d stores the outputs ES from the energy monitor 1c at every pulsed light emission during exposure and determines an average value $E_r$ of the pulse energy measured by the energy monitor 1c. The controller 1d outputs the average value $E_r$ to the exposure controller 26. The exposure controller 26 then analyzes the content of the exposure control error in step 130. The content of the exposure control error will be described below with reference to FIG. 5 (error cause identification map).

Figure 5:
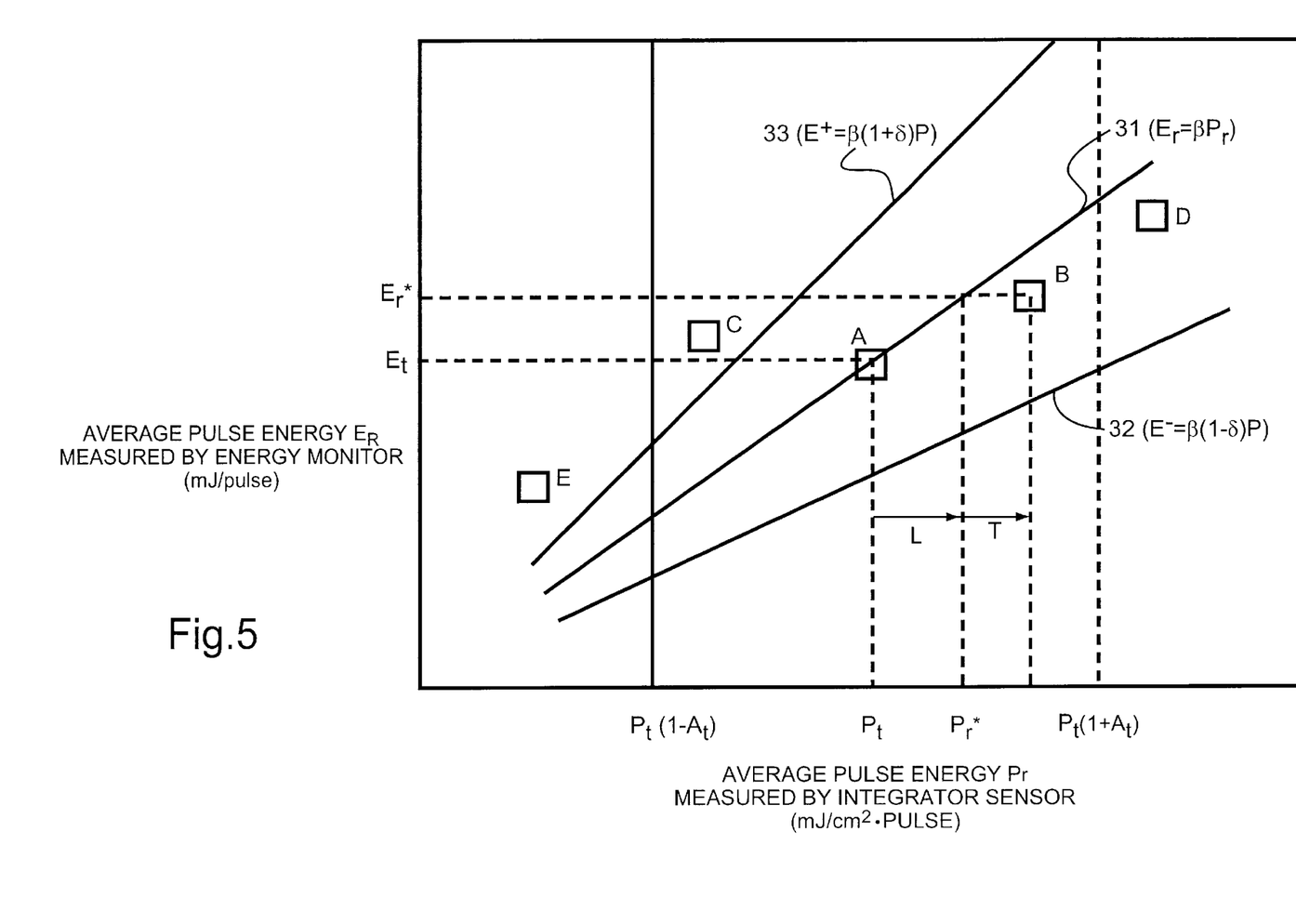
FIG. 5 indicates a possible distribution of the pulse energy measured by the integrator sensor and the pulse energy measured by the energy monitor during the exposure of an immediately previous shot area.

The graph of FIG. 5 indicates the possible distribution of the average value $P_r$ of the pulse energy measured by the integrator sensor 25 and the average value $E_r$ of the pulse energy measured by the energy monitor 1c. In the graph, the abscissa axis indicates the average value $P_r$ (mJ/(cm²·pulse)), and the ordinate axis indicates the average value $E_r$ (mJ/pulse). Measurement data A ($P_t$, $E_t$) including a set pulse energy value $P_t$ based on the integrator sensor 25 and a set energy value $E_t$ indicate target data determined before exposure. The other measurement data B, C, D, E indicate example combinations of the average pulse energy values measured by the integrator sensor 25 and the energy monitor 1c at the end of exposure of the shot area that has just been exposed. The straight line 31 indicates the design relationship between the average pulse energy values $E_r$, $P_r$ ($E_r = \beta \cdot P_r$)

The straight lines 32, 33 are lines corresponding to the lower and upper limits, respectively, of the allowable error of the control table (conversion coefficient $\beta$). The gradients (conversion coefficients) of the lines 32, 33 are expressed as $\beta(1-\delta)$ and $\beta(1+\delta)$, respectively, where $\delta$ is the quantity of the exposure amount target value precision $A_t$, for example, 1/3. The lower limit $E^-$ and upper limit $E^+$ of average value between which the average value $E_r$ of the pulse energy by the energy monitor 1c is allowed and which are indicated by the lines 32 and 33, respectively, are expressed as follows:

$$E^- = \beta(1-\delta)P \tag{13}$$

$$E^+ = \beta(1+\delta)P \tag{14}$$

On the abscissa axis of the graph of FIG. 5, a range of $P_t(1-A_t) \leq P_r \leq P_t(1+A_t)$, where $A_t$ is an exposure amount target value precision and Pt is a set amount of pulse energy, indicates a range within which an appropriate amount of exposure can be obtained. Within the range of $P_t(1-A_t) \leq P_r \leq P_t(1+A_t)$, the measurement data B is between the line 32 and the line 33, and the measurement data C is above the line 33 (if it is below the line 32, the same interpretation will be applied in the below description). Within the range of $P_t(1+A_t) < P_r$ or the range of $P_r < P_t(1-A_t)$, the measurement data D is between the line 32 and the line 33, and the measurement data E is above the line 33 (if it is below the line 32, the same interpretation will be applied). The manners of deviation of the four types of measurement data B, C, D, E from the measurement data A are interpreted as follows.

With respect to measurement data B, both the current control table (conversion coefficient) and the precision in control of the laser energy are within the allowable ranges, and there is no need to modulate the pulse energy for the next shot area, nor to update the control table. The vector L from $P_t$ to $P_r^*$ that is a value of the average $P_r$ of the pulse energy on the line 31 corresponding to the value $E_r^*$ of the average $E_r$ of the pulse energy in the measurement data B, is caused by an error in control of the pulse energy in the excimer laser light source 1. The vector T from Pr* to the measurement data B is caused by an error in the current control table. Errors in other measurement data can be divided in the same manner.

With respect to measurement data C, the current control table is outside the allowable range whereas the average of the pulse energy on the wafer is within the appropriate range. Consequently, the exposure control is acceptable With respect to measurement data D, the current control table is within the allowable range whereas the average of the pulse energy on the wafer is outside the appropriate range. Consequently, the exposure control is not acceptable.

Regarding measurement data E, both the current control table and the average of the pulse energy on the wafer are outside the allowable ranges.

By using the error cause identification map of FIG. 5, the content of the error in the exposure control for the previously exposed shot area is determined in step 120. Measures to be taken for the next shot corresponding to measurement data B to E are as follows.

If measurement data B or measurement data C is obtained as indicated in step 131, no particular measure is performed but the operation immediately proceeds to step 127 for exposure of the next area. Optionally, if measurement data C indicating a deviation of the control table from the allowable range is obtained, it is possible to prepare a control table as described in Section (A) and thereby update the control table used for the previously exposed shot area.

If measurement data D is obtained as indicated in step 132, the operation proceeds to step 133, in which the exposure controller 26 sends alarm information indicating that the pulse energy control based on the energy monitor 1c has not been within an acceptable range to the energy controller 1d of the excimer laser light source 1. In response to the alarm information, the energy controller 1d starts the self-reset operation as in step 138. After the self-reset, the energy controller 1d informs the exposure controller 26 of the completion of the self-reset. In response, the exposure of the next shot area is performed in step 127 and the subsequent steps.

If measurement data E is obtained as indicated in step 134, the operation proceeds to step 135, in which the exposure operation is stopped. In step 136, the exposure controller 26 sends alarm information indicating that the pulse energy control based on the energy monitor 1c has not been within an acceptable range to the energy controller 1d of the excimer laser light source 1. In response to the alarm information, the energy controller 1d starts the self-reset operation as in step 138. After the self-reset is completed, the operation proceeds to step 137, in which the exposure controller 26 prepares a control table as described in Section (A), and thereby updates the control table used for the previously exposed shot area. The exposure of the next shot area is then performed in step 127.

If a control table is to be prepared after measurement data C is obtained in step 131, the preparation of a control table may be performed by using the measurement data C obtained for the previously exposed shot area, instead of following the control table preparation sequence described in Section (A). More specifically, the control table can be quickly and accurately updated by substituting the conversion coefficient $\beta$ with a value $E_r'/P_r'$ ($=\beta'$) based on equation (5), where $P_r'$ is the average of the pulse energy based on the integrator sensor 25 in the measurement data C, and $E_r'$ is the average of the pulse energy based on the energy monitor 1c in the measurement data C.

The update of the control table may also be performed by multiplying the conversion coefficient $\beta$ used for the previously exposed shot area by a correction coefficient $\eta$. If the correction coefficient $\eta$ is defined as $\beta'/\beta$, the following equation corresponding to equation (5) is obtained:

$$E_t = \beta \cdot \eta \cdot P_t \tag{15}$$

The conversion coefficient $\beta$ and the correction coefficient $\eta$ are stored as a control table.

(D) Exposure Control Operation for Wide Range Set Exposure Amount

While the above-described control operation is an operation providing the same amount of exposure for all the shot areas on a wafer, an operation of sequentially varying the set amount of exposure of individual shot areas on a wafer by a predetermined difference is also needed in, for example, a test print for determining an appropriate amount of exposure. Therefore, the operation of varying the set amount of exposure as a test print progresses will be described below. Since the set amount of exposure in this operation must vary over a wide range, it becomes necessary to reduce the light energy using the energy rough modulator 3.

Although the transmittance of the energy rough modulator 3 can be varied by rotating the revolver to switch ND filters, it is difficult, however, to always set a desired transmittance of the energy rough modulator 3 with a required precision because of an error in positioning the revolver, a change over time of the transmittance of each ND filter, and the like. That is, it is difficult to set the transmittance of the energy rough modulator 3 to a desired value by open-loop control.

In addition, whereas the value $P_i$ of the processing amount of the integrator sensor 25 and the value $E_i$ of the output of the energy monitor 1c have a substantially linear relationship over a wide range when the energy rough modulator 3 remains fully open as indicated in FIG. 3, the relationship between the processing amount of the integrator sensor 25 and the output of the energy monitor 1c considerably changes in accordance with a change in the transmittance of the energy rough modulator 3. Therefore, in order to perform exposure control with a high precision, it is desirable to prepare a control table indicating the correlation between the processing amount P (mJ/(cm²·pulse)) of the integrator sensor 25 and the output ES (mJ/pulse) of the energy monitor 1c, corresponding to each ND filter of the energy rough modulator 3 set in the optical path of the laser beam LB. Accordingly, an example operation of determining a conversion coefficient $\beta$ as a control table based on equation (3) when the transmittance of the energy rough modulator 3 is changed will be described below. Since this operation is similar to the operation illustrated by the flowchart of FIG. 6, the below description will be made with reference to FIG. 6.

First, a set exposure amount $S_0$ of the photoresist on a wafer is set in the exposure controller 26 as in step 101 of FIG. 6. Corresponding to the setting, the exposure controller 26 sets an energy set value $E_t$ per pulse of the laser beam LB to a central energy value $E_0$. Subsequently, the exposure controller 26 causes the excimer laser light source 1 to perform pulsed light emission a plurality of times and sums the output from the integrator sensor 25, thereby indirectly measuring the average pulse energy density $p_0$ (mJ/cm²) on the wafer, as in step 102. The exposure controller 26 then calculates an exposure pulse number N in accordance with the following equation, as in step 103:

$$N = \text{cint}(S_0/p_0) \tag{16}$$

As in step 104, it is checked whether the exposure pulse number N exceeds or equals the minimum exposure pulse number Nmin. If $N < N_{min}$, an ND filter having a transmittance that establishes $N \geq N_{min}$ is selected from the ND filters of the energy rough modulator 3, and the selected ND filter is set in the optical path of the laser beam LB, as in step 105. The actual transmittance of the selected ND filter is herein defined as $T_{ND}'$.

The exposure controller 26 then sets an energy set value $E_t$ per pulse of the laser beam LB to the central energy value $E_0$ again as in step 102. The exposure controller 26 indirectly measures the average pulse energy density p0 (mJ/pulse) on the wafer, using the integrator sensor 25. The exposure controller 26 calculates an exposure pulse number N in accordance with the following equation as in step 103:

$$N = \text{cint}(S_0/T_{ND}'p_0) \tag{17}$$

During indirect measurement of the average pulse energy density on the wafer, the exposure controller 26 synchronously stores measurement data formed of an output of the energy monitor 1c and an output of the integrator sensor 25, at every single pulse or every cycle of a plurality of pulses. Although the output of an excimer laser light source normally varies from one pulse to another by ±5–7%, the employment of the measurement data stored as described above enables preparation of a control table as described in section (A) for a sufficiently wide range. That is, by using the measurement data thus stored, a conversion coefficient $\beta'$ corresponding to the conversion coefficient $\beta$ in equation (3) can be determined. The sequence that follows is as described above with reference to FIG. 6.

(E) Laser Energy Fine Adjustment And Stabilization

Discharge excited gas lasers, such as an excimer laser, normally require emission of several dozens of pulses of laser light before the energy of the emitted laser beam stabilizes at a desired value if the energy setting is changed, i.e., if, in the case of the excimer laser light source 1 shown in FIG. 2, the average level of the source voltage setting of the high voltage power source 1e is changed. The light pulses that are emitted until the pulse energy stabilizes are termed as "pre-pulses".

In accordance with the invention, the excimer laser light source 1 emits light pulses without irradiating the wafer 14 with the pulsed illumination light IL in order to stabilize the pulse energy of the excimer laser light source 1 before starting exposure of the wafer 14. The light emission of the excimer laser light source 1 that is performed without exposing the wafer 14 is termed as "dummy light emission".

For dummy light emission, the number of pre-pulses required for stabilization of the pulse energy of the excimer laser light source 1 is set to a constant number $N_{pr}$ that is determined considering the least favorable conditions. Given a light emission frequency f (Hz) of the excimer laser light source 1, the dummy light emission should be started at $N_{pr}/f$ (sec) before the exposure starts. The start timing of dummy light emission may also be determined based on the X-Y stage 20 carrying the wafer. That is, the dummy light emission may be started when the X-Y stage 20, moving at an average scanning speed of $V_w'$, reaches a position situated $V_w' \cdot N_{pr}/f$ before the exposure starting position.

In the projection exposure apparatus according to the invention, the movable illumination field diaphragm 9B is disposed in the optical path for limiting the reticle pattern image to be projected onto the wafer. The movable illumination field diaphragm 9B starts to open synchronously with the start of projection of the reticle pattern image onto the wafer. Before this synchronous operation, the wafer-carrying X-Y stage 20 and the reticle stage 15 start the pre-operation preceding the constant-speed scanning. Therefore, after the preoperation of the X-Y stage 20 and the reticle stage 15 starts, the dummy light emission of the excimer laser light source 1 is started at $N_{pr}/f$ (sec) before the time point at which the movable illumination field diaphragm 9B starts to open (the exposure starting time point), or when the X-Y stage 20 reaches a position situated $V_w' \cdot N_{pr}/f$ before the exposure starting position. Thereby, the pulse energy of the laser beam LB stabilizes by the time the pattern image of the reticle 11 is to be transferred to the wafer 14, achieving an appropriate total amount of exposure at each point on the wafer 14.

Although the above invention finely modulates the pulse energy during a shift between shot areas on the wafer, it is also possible to perform fine modulation of pulsed light emission by the excimer laser light source 1 during the exposure of a shot area on the wafer. That is, during scanning exposure of individual shot areas, the outputs from the integrator sensor 25 and the energy monitor 1c are inputted in real time, and the inputted results can be sequentially analyzed to update the conversion coefficient $\beta$ (control table) based on equation (3). Based on the updated conversion coefficient, the fine modulation of the pulsed laser energy can be performed during exposure of a current shot area.

Although the invention has been described in conjunction with the projection exposure apparatus having a pulsed emission type exposure light source, it should be apparent that the invention may be suitably modified for the exposure control in a step-and-scan projection exposure apparatus that uses a continuous emission type exposure light source such as a mercury lamp. Furthermore, the invention may also be modified for the exposure control in a full wafer type projection exposure apparatus such as a stepper.

As can be understood from the above description, the invention achieves various advantages. Since the exposure control method according to the invention finely modulates the emission power of the exposure light source, the method is able to finely modulate the energy of illumination light for exposure and, therefore, the amount of exposure of a photosensitive substrate at a high speed without employing an energy fine modulator disposed in the optical path of illumination light for finely modulating the transmittance (light reduction rate) by a mechanical drive and without causing an energy loss along the optical path of illumination light.

The illuminance of illumination light on a current shot area is monitored during sequential exposure of individual shot areas on the photosensitive substrate so that the fine modulation of emission power of the exposure light source is performed for the exposure of the next shot area on the photosensitive substrate in accordance with a monitoring deviation result from a target value. Therefore, the exposure control method advantageously achieves high precision exposure control separately for each shot area on the photosensitive substrate by utilizing the amount of exposure of a shot area that has just been exposed to adjust the amount of exposure of the next shot area to be exposed.

In addition, the exposure control method according to the invention controls the amount of exposure of a photosensitive substrate based on a correlation table between the illuminance of illumination light measured inside (or immediately out of) the exposure light source and the illuminance of illumination light on the photosensitive substrate (which is indirectly measured according to the invention). More specifically, a target value of a measurement by, for example, the energy monitor disposed inside the exposure light source, is calculated based on a measurement result obtained by an energy monitor, such as the integrator sensor, disposed in the main body of the exposure apparatus, and the correlation table. Based on the calculation result, the emission power of the exposure light source is finely modulated. Therefore, the exposure control method advantageously achieves a linearity in the exposure control based substantially on an energy monitor such as the integrator sensor.

Still further, the invention is capable of highly accurate exposure control in actual exposure of the photosensitive substrate, by determining a correlation table during the dummy light emission of the exposure light source, which is performed without actually exposing the photosensitive substrate.

The table of correlation between the illuminance of illumination light measured inside or immediately out of the exposure light source and the illuminance of illumination light on the photosensitive substrate can be updated when a change in the correlation is expected. By this operation, the method constantly achieves high precision exposure control even if the correlation changes over time.

In addition, since the invention employs a pulsed emission type light source as an exposure light source and performs pre-emission of light from the exposure light source for the number of pulses required for stabilization of the light emission power of the exposure light source when the emission power setting of the exposure light source is changed, the invention improves precision in the exposure control for the shot area to be exposed immediately after the emission power setting is changed. This control operation is particularly effective in a step-and-scan projection exposure apparatus since this type of projection exposure apparatus performs the pre-operation of the stage system preceding the exposure of individual shot areas on the photosensitive substrate, and during the pre-operation period, the pre-emission of light can easily be performed.

While the present invention has been described with reference to what is presently considered to be a preferred embodiment thereof, it is to be understood that the invention is not limited to the disclosed embodiment or constructions. To the contrary, the invention is intended to cover various modifications and equivalent arrangements included within the spirit and scope of the appended claims.

What is claimed is:

1. An exposure control method for controlling an amount of exposure of a substrate to illumination light in an exposure apparatus that illuminates a mask having a pattern with illumination light emitted from an exposure light source and thereby exposes the substrate to the illumination light through the mask to transfer the pattern of the mask to the substrate, the method comprising (a) finely modulating an emitting power of the exposure light source within a predetermined range by (b) determining a correlation between the emitting power of the exposure light source obtained by detecting an illuminance of the illumination light occurring inside or immediately out of the exposure light source and an amount of exposure on the substrate.

2. An exposure control method according to claim 1, wherein the exposure light source is a pulsed emission type light source, and wherein if the setting of emitting power of the exposure light source is to be changed, the method further comprising pre-emitting a number of pulses necessary for stabilization of the emitting power of the exposure light source.

3. An exposure control method according to claim 1, wherein step (a) is practiced by modulating the emitting power of the exposure light source in accordance with a target value.

4. An exposure control method according to claim 1, wherein the amount of exposure on the substrate is determined in accordance with an output of an integrator sensor disposed along an optical axis, and wherein step (b) is practiced by determining a correlation between the emitting power of the exposure light source and the output of the integrator sensor.

5. An exposure control method according to claim 4, wherein the exposure apparatus includes an energy rough modulator disposed along the optical axis, and wherein step (a) is further practiced by adjusting a transmittance of the energy rough modulator in accordance with a target exposure amount on the substrate.

6. An exposure control method according to claim 4, further comprising (c) synchronously recording output values corresponding to pulses of emitting power and the output of the integrator sensor as correlation data, and (d) storing the correlation data as a control table.

7. An exposure control method according to claim 6, wherein step (a) is further practiced by modulating the emitting power of the exposure light source in accordance with the integrator sensor output and the control table.

8. An exposure control method according to claim 7, further comprising (d) determining whether it is necessary to update the correlation between the emitting power of the exposure light source and the output of the integrator sensor.

9. An exposure control method according to claim 8, wherein step (d) is practiced by determining a total exposure amount at a point on the substrate, determining at least one of an average total exposure amount, a maximum total exposure amount and a minimum total exposure amount for the point on the substrate, and determining whether the total exposure amount is within the predetermined range.

10. An exposure control method according to claim 9, wherein if the total exposure amount is an unacceptable amount not within the predetermined range, the method further comprises determining a cause for the unacceptable amount in accordance with at least one of the average total exposure amount, the maximum total exposure amount and the minimum total exposure amount.

11. An exposure control method according to claim 10, further comprising initiating a self-reset operation of the exposure light source in accordance with the cause for the unacceptable amount.

12. An exposure control method according to claim 10, further comprising updating the correlation between the emitting power of the exposure light source and the output of the integrator sensor in accordance with the cause for the unacceptable amount.

13. An exposure control method according to claim 4, further comprising determining whether it is necessary to update the correlation between the emitting power of the exposure light source and the output of the integrator sensor during scanning exposure of a point on the substrate.

14. An exposure control method for controlling an amount of exposure of a substrate to illumination light in an exposure apparatus that illuminates a mask having a pattern with illumination light emitted from an exposure light source and thereby exposes the substrate to the illumination light through the mask to transfer the pattern of the mask to the substrate, the method comprising (a) finely modulating an emitting power of the exposure light source within a predetermined range by (b) determining a correlation between the emitting power of the exposure light source and an amount of exposure on the substrate; and (c) monitoring an illuminance of the illumination light in each shot area on the substrate when sequentially exposing a plurality of shot areas, wherein step (a) is practiced by finely modulating the emitting power of the exposure light source in accordance with a monitoring deviation result from a target value for exposure of the next shot area on the substrate.

15. An exposure control method according to claim 14, wherein the exposure light source is a pulsed emission type light source, and wherein if the setting of emitting power of the exposure light source is to be changed, the method further comprising pre-emitting a number of pulses necessary to stabilize the emitting power of the exposure light source.

16. An exposure control method for controlling an amount of exposure of a substrate to illumination light in an exposure apparatus that illuminates a mask having a pattern with illumination light emitted from an exposure light source and thereby exposes the substrate to the illumination light through the mask to transfer the pattern of the mask to the substrate, the method comprising:

(a) determining a table of correlation between an illuminance of the illumination light occurring inside or immediately out of the exposure light source and an illuminance of the illumination light occurring on the substrate; and (b) controlling the amount of exposure of the substrate to the illumination light on the basis of the table of correlation.

17. An exposure control method according to claim 16, wherein step (a) is practiced by performing dummy light emission from the exposure light source without exposing the substrate.

18. An exposure control method according to claim 17, further comprising updating the table of correlation if a change is expected in the correlation between the illuminance of the illumination light occurring inside or immediately out of the exposure light source and the illuminance of the illumination light occurring on the substrate.

19. An exposure control method according to claim 16, further comprising updating the table of correlation if a change is expected in the correlation between the illuminance of the illumination light occurring inside or immediately out of the exposure light source and an illuminance of the illumination light occurring on the substrate.

20. An exposure control method according to claim 16, further comprising prior to step (b) the step of setting an exposure amount, wherein step (b) is performed by setting an energy value of energy for the exposure light source based on the set exposure amount in accordance with the table of correlation.

21. An exposure control method according to claim 20, wherein the amount of exposure on the substrate is determined in accordance with an output of an integrator sensor disposed along an optical axis, the method further comprising performing pulsed light emission from the exposure light source, determining a total exposure amount in accordance with an output total of the integrator sensor, and determining whether fine modulation of the exposure amount is necessary in accordance with the total exposure amount.

22. An exposure control apparatus for controlling an exposure amount of a substrate to illumination light in an exposure apparatus that illuminates a mask having a pattern with illumination light emitted from an exposure light source and thereby exposes the substrate to the illumination light through the mask to transfer the pattern of the mask to the substrate, the apparatus comprising:

a light source modulation unit that finely modulates an emission power of the exposure light source within a predetermined range;

a first energy monitor communicating with the exposure light source, the first energy monitor detecting an illuminance of the illumination light occurring inside or immediately out of the exposure light source;

a second energy monitor disposed downstream of the first energy monitor, the second energy monitor receiving an exposure amount of illumination light corresponding to an exposure amount of illumination light on the substrate, the second energy monitor detecting an illuminance of the illumination light on the substrate; and a controller communicating with the light source modulation unit, the first energy monitor and the second energy monitor, the controller controlling the light source modulation unit on the basis of the detection results of the first and second energy monitors, wherein said controller comprises a memory storing a control table containing data representing a correlation amount between the emission power of the exposure light source and the output of the second energy monitor.

23. An exposure control apparatus according to claim 22, further comprising an energy rough modulator disposed downstream of the exposure light source, the energy rough modulator changing a transmittance of the illumination light emitted from the exposure light source.

24. An exposure control apparatus according to claim 23, wherein said controller communicates with the energy rough modulator to control the transmittance of the illumination light.

25. An exposure control apparatus according to claim 22, further comprising a beam splitter disposed downstream of the exposure light source, the beam splitter reflecting the illumination light toward the second energy monitor.

26. An exposure method for exposing a pattern of a mask to a substrate by means of an energy beam from an energy source, the method comprising:

(a) determining a table of correlation between an energy of the energy beam occurring inside or immediately out of the energy source and an energy of the energy beam occurring on the substrate; and (b) controlling an amount of exposure of the substrate to the energy beam based on the table of correlation within a predetermined range.

27. An exposure method wherein a substrate is exposed by irradiating a pattern of a mask with an exposure beam by using an illumination system having an optical integrator disposed in the optical path of the exposure beam so that the pattern is projected onto the substrate, the method comprising:

detecting a first energy of the exposure beam at a first position in the illumination system by using a first sensor;

detecting a second energy of the exposure beam at a second position between the mask and the optical integrator that is different from the first position in the illumination system by using a second sensor; and determining correlation data according to a detection signal from the first sensor and a detection signal from the second sensor.

28. An exposure method according to claim 27, wherein the illumination system has a light source that emits the exposure beam, and wherein the first sensor detects the exposure beam within the light source.

29. An exposure method according to claim 28, further comprising adjusting an amount of exposure of the substrate based on the correlation data.

30. An exposure method according to claim 29, wherein the step of adjusting the amount of exposure of the substrate includes adjusting a light emission energy of the exposure beam emitted from the light source.

31. An exposure method according to claim 27, wherein the amount of exposure is adjusted during exposure of the substrate.

32. An exposure method according to claim 27, wherein the detection signal from the second sensor is a signal that corresponds to an amount of exposure of the substrate.

33. An exposure method according to claim 27, wherein the detection signal from the first sensor and the detection signal from the second sensor are signals that are expressed in different units.

34. An exposure method according to claim 27, wherein said optical integrator comprises a fly eye lens.

35. An exposure apparatus for exposing a substrate by irradiating a pattern of a mask with an exposure beam by using an illumination system having an optical integrator disposed in the optical path of the exposure beam so that the pattern is projected onto the substrate, the apparatus comprising:

a first sensor that detects a first energy of the exposure beam at a first position in the illumination system;

a second sensor that detects a second energy of the exposure beam at a second position between the mask and the optical integrator that is different from the first position in the illumination system; and a controller that determines correlation data according to a detection signal from the first sensor and a detection signal from the second sensor.

36. An exposure apparatus according to claim 35, wherein said optical integrator comprises a fly eye lens.

37. A laser light source apparatus for supplying an exposure beam to an exposure apparatus, comprising:

a laser emitter device that emits a laser beam;

an energy sensor that detects an energy of said laser beam emitted from said laser emitter device and occurring inside or immediately out of the laser light source apparatus; and an adjuster connected to said energy sensor and to said laser emitter device, said adjuster adjusting said energy of said laser beam emitted from said laser emitter device based on a result of detection by a detector that is provided in said exposure apparatus for detecting said laser beam and a result of detection by said energy sensor.

38. A laser light source apparatus according to claim 37, wherein said detector provided in said exposure apparatus detects said laser beam converted into an illumination light that has a uniform illuminance distribution.

39. A laser light sourse apparatus according to claim 37, further comprising:

a beam splitter that guides a portion of said laser beam emitted from the laser emitter device to said energy sensor; and a shutter that is disposed downstream of said beam splitter and that blocks a laser beam supplied from said laser emitter device to said exposure apparatus.

40. A laser light source apparatus according to claim 37, wherein said laser beam is a pulse beam, and wherein said controller performs a fine adjustment of energy per pulse.

41. A laser light source apparatus for supplying an exposure beam to an exposure apparatus, comprising:

a laser emitter device that emits a laser beam;

an energy sensor that detects an energy of said laser beam emitted from said laser emitter device; and an adjuster connected to said energy sensor and to said laser emitter device, said adjuster adjusting said energy of said laser beam emitted from said laser emitter device based on a result of detection by a detector that is provided in said exposure apparatus for detecting said laser beam and a result of detection by said energy sensor, wherein said adjuster includes a high-voltage power source that drives said laser emitter device, and a controller that adjusts a voltage of said high-voltage power source based on said results of detection by said detector and said energy sensor.

42. A laser light source apparatus according to claim 41, wherein said laser beam is a pulse beam, and wherein said controller performs a fine adjustment of energy per pulse.

43. A laser light source apparatus according to claim 41, wherein said detector provided in said exposure apparatus detects said laser beam converted into an illumination light that has a uniform illuminance distribution.

44. A laser light source apparatus according to claim 41, further comprising:

a beam splitter that guides a portion of said laser beam emitted from the laser emitter device to said energy sensor; and a shutter that is disposed downstream of said beam splitter and that blocks a laser beam supplied from said laser emitter device to said exposure apparatus.

* * * * *